(12) United States Patent
Li et al.

(10) Patent No.: US 11,315,476 B2
(45) Date of Patent: Apr. 26, 2022

(54) POWER MANAGEMENT CHIP AND RELATED DRIVING METHOD AND DRIVING SYSTEM

(71) Applicant: TCL CHINA STAR OPTOELECTRONICS TECHNOLOGY CO., LTD., Shenzhen (CN)

(72) Inventors: Wenfang Li, Shenzhen (CN); Dan Cao, Shenzhen (CN)

( * ) Notice: Subject to any disclaimer, the term of this patent is extended or adjusted under 35 U.S.C. 154(b) by 411 days.

(21) Appl. No.: 16/619,473

(22) PCT Filed: Nov. 14, 2019

(86) PCT No.: PCT/CN2019/118455
§ 371 (c)(1),
(2) Date: Dec. 5, 2019

(87) PCT Pub. No.: WO2021/047027
PCT Pub. Date: Mar. 18, 2021

(65) Prior Publication Data
US 2021/0366337 A1 Nov. 25, 2021

(30) Foreign Application Priority Data

Sep. 12, 2019 (CN) .......................... 201910862073.4

(51) Int. Cl.
*G09G 3/20* (2006.01)
(52) U.S. Cl.
CPC ..... *G09G 3/2096* (2013.01); *G09G 2330/021* (2013.01); *G09G 2330/12* (2013.01)

(58) Field of Classification Search
CPC ......... G09G 3/20; G09G 3/2092–2096; G09G 3/3696; G09G 2330/12; G09G 2330/021; G09G 2310/08
See application file for complete search history.

(56) References Cited

U.S. PATENT DOCUMENTS

| 10,152,911 B2 * | 12/2018 | Tsai ..................... G09G 3/2092 |
| 2007/0164970 A1 * | 7/2007 | Oh ........................ G09G 5/006 345/99 |

(Continued)

FOREIGN PATENT DOCUMENTS

| CA | 109388345 A | 2/2019 |
| CA | 109558083 A | 4/2019 |

(Continued)

*Primary Examiner* — Patrick F Marinelli

(57) ABSTRACT

The present disclosure proposes a power management chip, a driving method, and a driving system. The power management chip includes a register, a signal receiving circuit configured to receive a second voltage data, and a processing circuit configured to examine the first voltage data and the second voltage data and write the second voltage data into the register when the first voltage data and the second voltage data are different. After the signal receiving circuit receives the second voltage data, the processing circuit examines the first voltage data and the second voltage data to prevent the first voltage data from being modified. This prevents the abnormality of the display and solves the above-mentioned problem of a conventional power management chip, whose data may be modified such that the display panel abnormally displays.

15 Claims, 4 Drawing Sheets

(56) References Cited

U.S. PATENT DOCUMENTS

| | | |
|---|---|---|
| 2012/0154416 A1 | 6/2012 | Nakanishi |
| 2014/0068374 A1* | 3/2014 | Ha .................... G09G 5/00 714/755 |
| 2016/0104405 A1* | 4/2016 | Fang .................. G09G 3/20 345/204 |
| 2017/0162106 A1* | 6/2017 | Tsai .................. G09G 3/3696 |
| 2018/0158397 A1 | 6/2018 | Nam et al. |
| 2019/0066632 A1 | 2/2019 | Wang |
| 2019/0130812 A1* | 5/2019 | Shang ............... G09G 3/2092 |
| 2020/0143860 A1 | 5/2020 | He |
| 2021/0043169 A1* | 2/2021 | Bae .................. G09G 5/363 |
| 2021/0210029 A1* | 7/2021 | Zhang ................ G09G 3/36 |
| 2021/0272493 A1* | 9/2021 | Nam .................. G09G 3/3696 |
| 2021/0327318 A1* | 10/2021 | Huang ............... G09G 3/006 |
| 2021/0335205 A1* | 10/2021 | Li .................... G09G 3/20 |
| 2021/0366337 A1* | 11/2021 | Li .................... G09G 3/20 |

FOREIGN PATENT DOCUMENTS

| | | | |
|---|---|---|---|
| CN | 102568395 A | | 7/2012 |
| CN | 106448597 A | | 2/2017 |
| CN | 107526979 A | | 12/2017 |
| CN | 107863058 A | * | 3/2018 |
| CN | 107863058 A | | 3/2018 |
| CN | 108172180 A | | 6/2018 |
| CN | 109493894 A | | 3/2019 |
| EP | 0618563 A1 | | 10/1994 |

* cited by examiner

POWER MANAGEMENT CHIP AND RELATED DRIVING METHOD AND DRIVING SYSTEM

FIELD OF THE INVENTION

The present invention relates to display field, and more particularly to a power management chip and related driving method and driving system.

BACKGROUND

A power management chip outputs signal to a display panel. Due to the problem of manufacturing the power management chip, the output data might be modified such that display panel abnormally displays images. This becomes a technical issue of the power management chip.

SUMMARY

One objective of an embodiment of the present invention is to provide a power management chip and related driving method and driving system to solve the above-mentioned problem.

According to an embodiment of the present invention, a power management chip is provided. The power management chip comprises: a register, configured to store a first voltage data; a signal receiving circuit, configured to receive a second voltage data; and a processing circuit, configured to examine the first voltage data and the second voltage data and write the second voltage data into the register when the first voltage data and the second voltage data are different.

Optionally, the processing circuit comprises a comparing module and a writing module, the comparing module is configured to compare the first voltage data with the second voltage data and trigger the writing module when the first voltage data and the second voltage data are different, and the writing module is configured to write the second voltage data into the register when the writing module is triggered.

Optionally, the comparing module comprises a comparator, configured to output the second voltage data to trigger the writing module when the first voltage data and the second voltage data are different.

Optionally, the signal receiving circuit is configured to receive the second voltage data from a timing controlling chip.

Optionally, the signal receiving circuit is configured to send a voltage data obtaining instruction to the timing controlling chip and to receive the second voltage data from the timing controlling chip.

Optionally, the power management chip further comprises an examining module, configured to obtain a first examination code, to process the second voltage data to generate a second examination code, to determine whether the first examination code and the second examination code are the same, and to load the second voltage data from the signal receiving circuit if the first examination code and the second examination code are different.

Optionally, the power management chip further comprises a control module, configured to control the processing circuit to examine the first voltage data and the second voltage data in a blank time period of a frame.

According to an embodiment of the present invention, a power management chip is provided. A driving method of a power management chip is provided. The driving method comprises: providing a register to store a first voltage data; utilizing a signal receiving circuit to receive a second voltage data; and utilizing a processing circuit to examine the first voltage data stored in the register and the second voltage data received by the signal receiving circuit and write the second voltage data into the register when the first voltage data and the second voltage data are different.

Optionally, the step of utilizing the processing circuit to examine the first voltage data and the second voltage data comprises: utilizing a comparison module to compare the first voltage data with the second voltage data and trigger the writing module when the first voltage data and the second voltage data are different; and utilizing the triggered writing module to overwrite the data stored in the register with the second voltage data.

Optionally, the step of utilizing the comparison module to compare the first voltage data with the second voltage data comprises: utilizing a comparator to compare the first voltage data with the second voltage data; and triggering the writing module when the first voltage data and the second voltage data are different and outputting the second voltage data to the writing module.

Optionally, the step of utilizing the signal receiving circuit to receive the second voltage data comprises: utilizing the signal receiving circuit to obtain the second voltage data from a timing controlling chip.

Optionally, the step of utilizing the signal receiving circuit to obtain the second voltage data from the timing controlling chip comprises: utilizing the signal receiving circuit to send an instruction to the timing controlling chip and obtaining the second voltage data from the timing controlling chip.

Optionally, the step of utilizing the signal receiving circuit to receive the second voltage data comprises: obtaining a first examination code with an examining module; processing the second voltage data to generate a second examination code with the examining module; and reloading the second voltage data from the signal receiving circuit if the first examination code and the second examination code are different.

Optionally, the step of utilizing the processing circuit to examine the first voltage data and the second voltage data comprises: utilizing the processing circuit to exam the first voltage data and the second voltage data in a blank time period of a frame.

Optionally, the step of utilizing the control module to examine the first voltage data and the second voltage data in the blank time period comprises: utilizing the control module to periodically examine the first voltage data and the second voltage data in the blank time period.

According to an embodiment of the present invention, a driving system is provided. The driving system comprises: a storage chip, configured to store a second voltage data; a timing controlling chip, configured to receive the second voltage data of the storage chip; and a power management chip, configured to output a voltage data to a display panel; wherein the power management chip comprises a register, a signal receiving circuit and a processing circuit; wherein the register is configured to store a first voltage data, the signal receiving circuit is configured to receive a second voltage data, and the processing circuit is configured to examine the first voltage data and the second voltage data and to write the second voltage data into the register when the first voltage data and the second voltage data are different.

Optionally, the timing controlling chip is configured to receive the second voltage data of the storage chip and to transfer the second voltage data to the power management chip.

Optionally, the processing circuit comprises a comparing module and a writing module, the comparing module is configured to compare the first voltage data with the second voltage data and trigger the writing module when the first voltage data and the second voltage data are different, and the writing module is configured to write the second voltage data into the register when the writing module is triggered.

Optionally, the comparing module comprises a comparator, configured to output the second voltage data to trigger the writing module when the first voltage data and the second voltage data are different.

Optionally, the power management chip further comprises an examining module, configured to obtain a first examination code, to process the second voltage data to generate a second examination code, to determine whether the first examination code and the second examination code are the same, and to load the second voltage data from the signal receiving circuit if the first examination code and the second examination code are different.

According to an embodiment of the present invention, a power management chip and related driving method and driving system are provided. The power management chip comprises a register, a signal receiving circuit and a processing circuit. The register stores a first voltage data. The signal receiving circuit receives a second voltage data. The processing circuit examines the first voltage data and the second voltage data and uses the second voltage data to overwrite the first voltage data stored in the register when the first voltage data and the second voltage data are different. In other words, after the signal receiving circuit receives the second voltage data, the processing circuit examines the first voltage data and the second voltage data to prevent the first voltage data from being modified. This also prevents the abnormality of the display and solves the above-mentioned problem of a conventional power management chip, whose data may be modified such that the display panel abnormally displays.

BRIEF DESCRIPTION OF THE DRAWINGS

The accompanying drawings described herein are used to provide further comprehension of the present disclosure, and is a part of the present application. Schematic embodiments of the present disclosure and the description thereof are used to illustrate the present disclosure, but do not constitute any improper limit to the present disclosure. In the accompanying drawings.

DETAILED DESCRIPTION OF PREFERRED EMBODIMENTS

Specifically, the terminologies in the embodiments of the present invention are merely for describing the purpose of the certain embodiment, but not to limit the invention. Examples and the appended claims be implemented in the present invention requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

Figure 1:
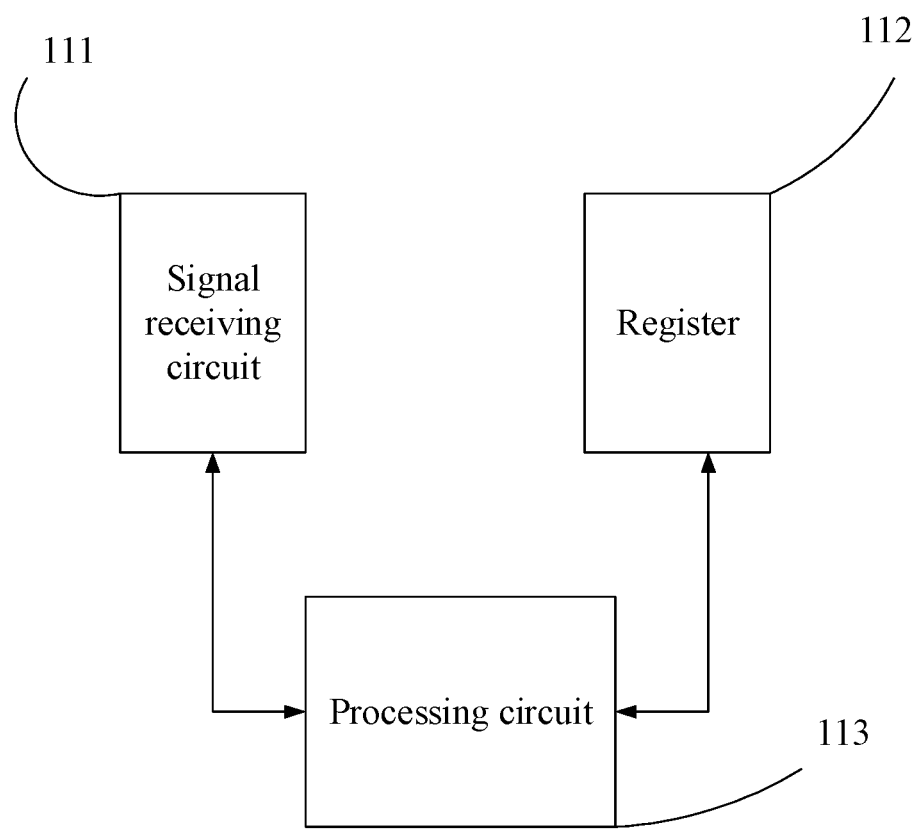
FIG. 1 is a diagram of a power management chip according to an embodiment of the present invention.

Please refer to FIG. 1. FIG. 1 is a diagram of a power management chip according to an embodiment of the present invention. The power management chip comprises a register 112 configured to store a first voltage data, a signal receiving circuit 111 configured to receive a second voltage data, and a processing circuit 113 configured to examine the first voltage data and the second voltage data and write the second voltage data over the data stored in the register when the first voltage data and the second voltage data are different.

According to an embodiment of the present invention, a power management chip is provided. The power management chip comprises a register, a signal receiving circuit and a processing circuit. The register stores a first voltage data. The signal receiving circuit receives a second voltage data. The processing circuit examines the first voltage data and the second voltage data and uses the second voltage data to overwrite the first voltage data stored in the register when the first voltage data and the second voltage data are different. In other words, after the signal receiving circuit receives the second voltage data, the processing circuit examines the first voltage data and the second voltage data to prevent the first voltage data from being modified. This also prevents the abnormality of the display and solves the above-mentioned problem of a conventional power management chip, whose data may be modified such that the display panel abnormally displays.

In an embodiment, the processing circuit comprises a comparison module and a writing module. The comparison module is configured to compare the first voltage data with the second voltage data and trigger the writing module when the first voltage data and the second voltage data are different. The writing module is triggered to overwrite the data stored in the register with the second voltage data. After the signal receiving circuit receives the second voltage data, the comparison module compares the first voltage data with the second voltage data and triggers the writing module to overwrite the data stored in the register with the second voltage data if the first voltage data and the second voltage data are different. In this way, the output voltage of the power management chip is correct such that the display could normally display.

In an embodiment, the comparison module comprises a comparator, configured to output the second voltage data to trigger the writing module when the first voltage data and the second voltage data are different. The first voltage data and the second voltage data are inputted into the comparator such that the comparator could compare the first voltage data with the second voltage data. If the first voltage data and the second voltage data are different, the comparator outputs the second voltage data. However, if the first voltage data and the second voltage data are the same, the comparator could still output the second voltage data such that the writing module could write the second voltage data into the register to ensure that the first voltage data stored in the temporarily storing is correct. This makes the power management chip output the correct data such that the display panel could normally display.

In an embodiment, the signal receiving circuit is configured to obtain the second voltage data from a timing controlling chip.

In an embodiment, the signal receiving circuit is configured to send a voltage data obtaining instruction to the timing controlling chip and to obtain the second voltage data sent by the timing controlling chip. When the signal receiving circuit wants to receive the second voltage data from the timing controlling chip, the signal receiving circuit could send a voltage data instruction to the timing controlling chip and then receive the second voltage data from the timing controlling chip. Or, the timing controlling chip could send a feedback instruction to the signal receiving circuit such that the signal receiving circuit could generate the second voltage data.

In an embodiment, the power management chip comprises an examining module, configured to obtain a first examination code, to process the second voltage data to generate a second examination code, to determine whether the first examination code and the second examination code are the same, and to load the second voltage data from the signal receiving circuit if the first examination code and the second examination code are different. When the signal receiving circuit receives the second voltage data, the accuracy of the second voltage data is firstly examined. That is, the examining module obtains the first examination code, processes the received second voltage data to generate the second examination code, and determines whether the first examination code and the second examination code are the same. If the first examination code and the second examination code are the same, it represents that the obtained second voltage data is correct. If the first examination code and the second examination code are different, the signal receiving circuit loads the second voltage data to ensure the accuracy of the second voltage data and to further ensure the accuracy of the first voltage data.

Figure 2:
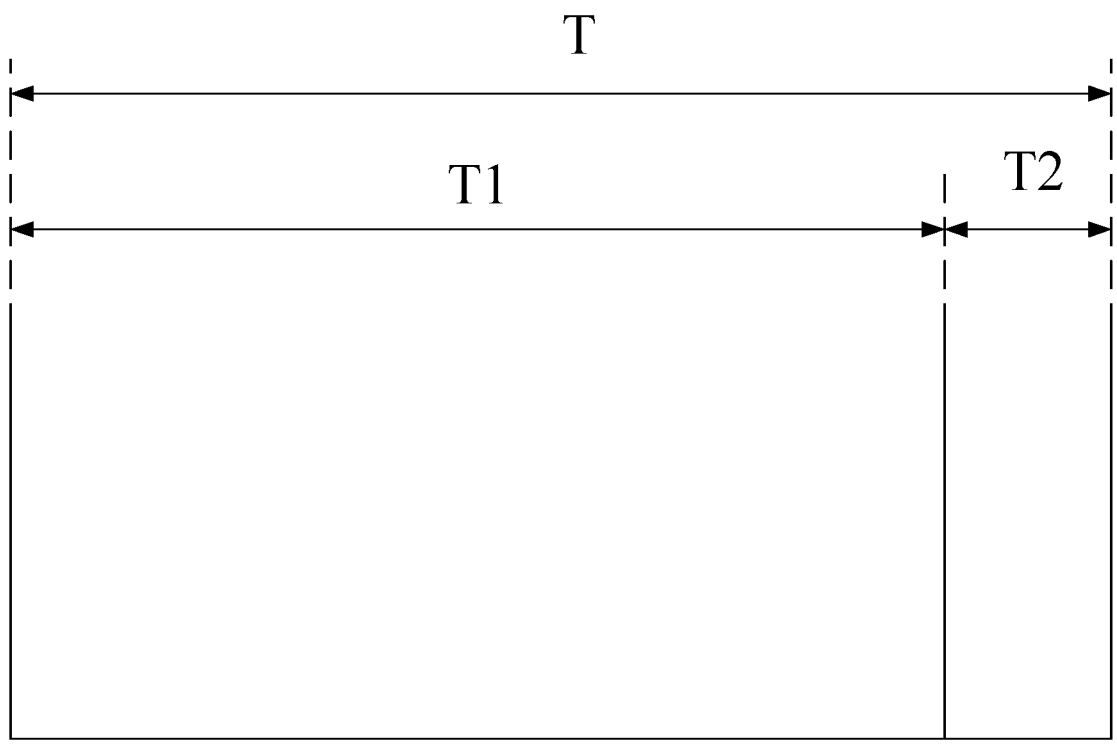
FIG. 2 is a diagram of a frame.

Please refer to FIG. 2. FIG. 2 is a diagram of a frame. As shown in FIG. 2, a frame time T in the driving system comprises a display time period T1 and a blank time period T2. In an embodiment, the power management chip further comprises a control module configured to control the processing circuit to examine the first voltage data and the second voltage data in the blank time period of a frame. Because the power management chip needs to transfer data to the display panel in the display time period such that the display panel could normally display, in this embodiment, the power management chip still normally transfers data to the display panel in the display time period to avoid any interferences of the data examination in the display time period and to allow the display panel to normally display images.

In an embodiment, the control module controls the processing circuit to periodically examine the first voltage data and the second voltage data. That is, the control module controls the processing circuit to periodically examine the first voltage data and the second voltage data in the blank time period. In this way, the resources of the power management chip are not enormously occupied but the data examinations are still enough to ensure that the data in the power management chip are not modified.

Figure 3:
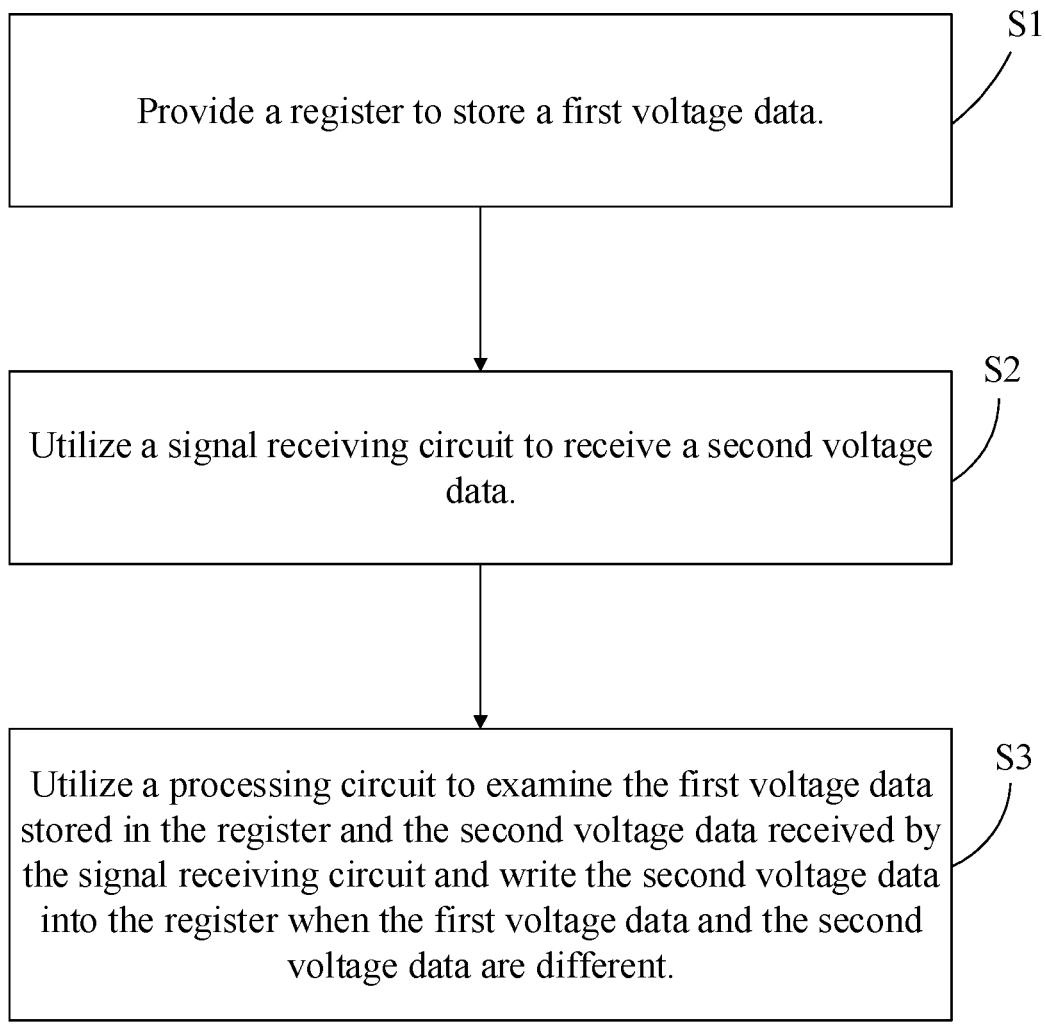
FIG. 3 is a flow chart of a driving method of the power management chip according to an embodiment of the present invention.

Please refer to FIG. 3. FIG. 3 is a flow chart of a driving method of the power management chip according to an embodiment of the present invention. The driving method comprises:

S1: providing a register to store a first voltage data.

S2: utilizing a signal receiving circuit to receive a second voltage data.

S3: utilizing a processing circuit to examine the first voltage data stored in the register and the second voltage data received by the signal receiving circuit and write the second voltage data into the register when the first voltage data and the second voltage data are different.

In an embodiment of the present invention, a driving method of the power management chip is provided. The power management chip comprises a register, a signal receiving circuit and a processing circuit. The register is configured to store a first voltage data. The signal receiving circuit is configured to receive a second voltage data. The processing circuit is configured to examine the first voltage data and the second voltage data and write the second voltage data over the data stored in the register when the first voltage data and the second voltage data are different. After the signal receiving circuit receives the second voltage data, the processing circuit examines the first voltage data and the second voltage data to prevent the first voltage data from being modified. This also prevents the abnormality of the display and solves the above-mentioned problem of a conventional power management chip, whose data may be modified such that the display panel abnormally displays.

In an embodiment, the step of utilizing the processing circuit to examine the first voltage data and the second voltage data comprises: utilizing the comparison module to compare the first voltage data with the second voltage data and trigger the writing module when the first voltage data and the second voltage data are different; utilizing the triggered writing module to overwrite the data stored in the register with the second voltage data; when the signal receiving circuit receives the second voltage data, the second voltage data needs to be examined to avoid the inaccuracy of the second voltage data. The examining module can be used to obtain the first examination code at the same time when the signal receiving circuit obtains the second voltage data. The examining module obtains the second examination code according to the second voltage data and compares the first examination code with the second examination code. When the second voltage data changes, the second examination code changes accordingly. Therefore, by comparing the first examination code with the second examination code, the signal receiving circuit could reload the second voltage data when the first examination code and the second examination code are different. The examining module could keep examining until the obtained second voltage data is correct.

In an embodiment, the step of utilizing the processing circuit to examine the first voltage data and the second voltage data comprises: utilizing the control module to exam the first voltage data and the second voltage data in the blank time period. In order not to affect the normal work of the power management chip in the display time period, the control module could control the processing circuit to examine the first voltage data and the second voltage data in the blank time period.

In an embodiment, the step of utilizing the control module to examine the first voltage data and the second voltage data in the blank time period comprises: utilizing the control module to periodically examine the first voltage data and the second voltage data in the blank time period. That is, a period could be set for examining the first voltage data and the second voltage data in the blank time period such that the first voltage data and the second voltage data could be periodically examined. This could avoid occupying too much resources of the power management chip but could still ensure that the first voltage data is correct.

Figure 4:
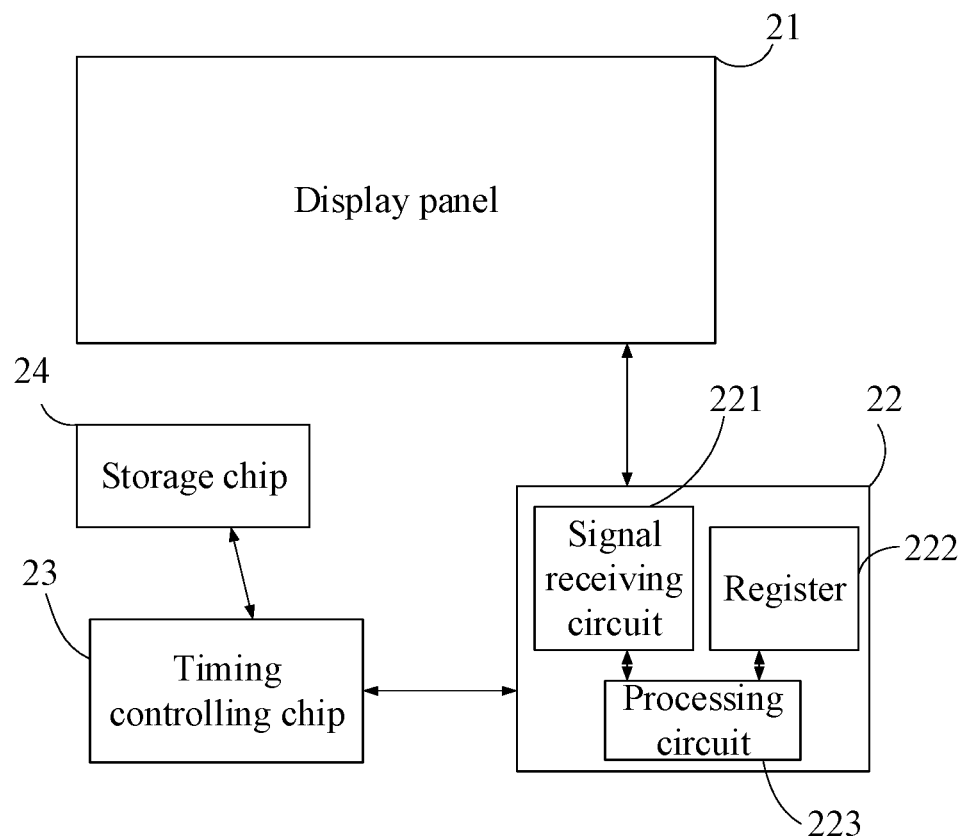
FIG. 4 is a diagram of a driving system according to an embodiment of the present invention.

Please refer to FIG. 4. FIG. 4 is a diagram of a driving system according to an embodiment of the present invention. The driving system comprises: a storage chip 24 configured to store a second voltage data; a timing controlling chip 23, configured to receive the second voltage data of the storage chip; and a power management chip 22, configured to output a voltage data to a display panel 21. The power management chip 22 comprises a register 222, a signal receiving circuit 221 and a processing circuit 223. The register 222 is configured to store a first voltage data. The signal receiving circuit 221 is configured to receive a second voltage data. The processing circuit 223 is configured to examine the first voltage data and the second voltage data and to overwrite the data in the register 221 with the second voltage data when the first voltage data and the second voltage data are different.

In an embodiment, the driving system comprises a storage chip configured to store a second voltage data, a timing controlling chip configured to receive the second voltage data of the storage chip, and a power management chip. The power management chip comprises a register, a signal receiving circuit and a processing circuit. The register s configured to store the first voltage data. The signal receiving circuit is configured to receive the second voltage data. The processing circuit is configured to examine the first voltage data and the second voltage data and to overwrite the data in the register with the second voltage data when the first voltage data and the second voltage data are different. After the signal receiving circuit receives the second voltage data, the processing circuit examines the first voltage data and the second voltage data to prevent the first voltage data from being modified. This also prevents the abnormality of the display and solves the above-mentioned problem of a conventional power management chip, whose data may be modified such that the display panel abnormally displays.

In an embodiment, the timing controlling chip is configured to receive the second voltage data of the storage chip and transfer the second voltage data to the power management chip. When the power management chip receives the voltage data from the storage chip, the storage chip first transfers the second voltage data to the timing controlling chip and then the timing controlling chip transfer the second voltage data to the power management chip.

In an embodiment, the processing circuit comprises a comparison module and a writing module. The comparison module is configured to compare the first voltage data with the second voltage data and trigger the writing module when the first voltage data and the second voltage data are different. The writing module is triggered to overwrite the data stored in the register with the second voltage data.

In an embodiment, the comparison module comprises a comparator, configured to output the second voltage data to trigger the writing module when the first voltage data and the second voltage data are different.

In an embodiment, the power management chip comprises an examining module, configured to obtain a first examination code, to process the second voltage data to generate a second examination code, to determine whether the first examination code and the second examination code are the same, and to load the second voltage data from the signal receiving circuit if the first examination code and the second examination code are different.

In an embodiment, the examining module examines whether the second voltage data loaded to the signal receiving circuit changes and issues an instruction if the second voltage data changes. The storage chip outputs again the second voltage data when the examining module issues the instruction. When the storage chip transfers the second voltage data to the power management chip via the timing controlling chip, the examining module could examine the second voltage data in order to prevent the data from being changed. When the examining module determines that the second voltage data changes, the examining module issues the instruction. Then, the storage chip outputs again the second voltage data when the examining module issues the instruction in order to prevent the data outputted from the storage chip to the power management chip from being changed. This mechanism could check the data outputted to the power management chip and thus makes the data correct.

In an embodiment, the power management further comprises a control module, configured to control the processing circuit to examine the first voltage data and the second voltage data in the blank time period.

In an embodiment, the control module is configured to control the processing circuit to periodically examine the first voltage data and the second voltage data in the blank time period.

In an embodiment, the above period is 16 ms. As previously mentioned, the first voltage data and the second voltage data could be periodically examined. The period for examining the first voltage data and the second voltage data could be set as 16 ms. In this way, the accuracy of the first voltage data could be ensured without affecting the normal operation of the power management chip.

In sum, a power management chip and related driving method and driving system are provided. The power management chip comprises a register, a signal receiving circuit and a processing circuit. The register stores a first voltage data. The signal receiving circuit receives a second voltage data. The processing circuit examines the first voltage data and the second voltage data and uses the second voltage data to overwrite the first voltage data stored in the register when the first voltage data and the second voltage data are different. In other words, after the signal receiving circuit receives the second voltage data, the processing circuit examines the first voltage data and the second voltage data to prevent the first voltage data from being modified. This also prevents the abnormality of the display and solves the above-mentioned problem of a conventional power management chip, whose data may be modified such that the display panel abnormally displays.

Above are embodiments of the present invention, which does not limit the scope of the present invention. Any modifications, equivalent replacements or improvements within the spirit and principles of the embodiment described above should be covered by the protected scope of the invention.

What is claimed is:

1. A power management chip, comprising:
 a register, configured to store a first voltage data;
 a signal receiving circuit, configured to receive a second voltage data;
 a processing circuit, configured to examine the first voltage data and the second voltage data and write the second voltage data into the register when the first voltage data and the second voltage data are different;
 an examining module, configured to obtain a first examination code, to process the second voltage data to generate a second examination code, to determine whether the first examination code and the second examination code are the same, and to load the second voltage data from the signal receiving circuit when the first examination code and the second examination code are different; and
 a control module, configured to control the processing circuit to examine the first voltage data and the second voltage data in a blank time period of a frame.

2. The power management chip of claim 1, wherein the processing circuit comprises a comparing module and a writing module, the comparing module is configured to compare the first voltage data with the second voltage data and trigger the writing module when the first voltage data and the second voltage data are different, and the writing module is configured to write the second voltage data into the register when the writing module is triggered.

3. The power management chip of claim 2, wherein the comparing module comprises a comparator, configured to output the second voltage data to trigger the writing module when the first voltage data and the second voltage data are different.

4. The power management chip of claim 1, wherein the signal receiving circuit is configured to receive the second voltage data from a timing controlling chip.

5. The power management chip of claim 4, wherein the signal receiving circuit is configured to send a voltage data obtaining instruction to the timing controlling chip and to receive the second voltage data from the timing controlling chip.

6. A driving method of a power management chip, the driving method comprising:
   providing a register to store a first voltage data;
   utilizing a signal receiving circuit to receive a second voltage data; and
   utilizing a processing circuit to examine the first voltage data stored in the register and the second voltage data received by the signal receiving circuit and write the second voltage data into the register when the first voltage data and the second voltage data are different;
   wherein the step of utilizing the signal receiving circuit to receive the second voltage data comprises:
      obtaining a first examination code with an examining module;
      processing the second voltage data to generate a second examination code with the examining module; and
      reloading the second voltage data from the signal receiving circuit when the first examination code and the second examination code are different; and
   wherein the step of utilizing the processing circuit to examine the first voltage data and the second voltage data comprises: utilizing the processing circuit to exam the first voltage data and the second voltage data in a blank time period of a frame.

7. The driving method of claim 6, wherein the step of utilizing the processing circuit to examine the first voltage data and the second voltage data comprises: utilizing a comparison module to compare the first voltage data with the second voltage data and trigger the writing module when the first voltage data and the second voltage data are different; and utilizing the triggered writing module to overwrite the data stored in the register with the second voltage data.

8. The driving method of claim 7, wherein the step of utilizing the comparison module to compare the first voltage data with the second voltage data comprises: utilizing a comparator to compare the first voltage data with the second voltage data; triggering the writing module when the first voltage data and the second are different and outputting the second voltage data to the writing module.

9. The driving method of claim 6, wherein the step of utilizing the signal receiving circuit to receive the second voltage data comprises: utilizing the signal receiving circuit to obtain the second voltage data from a timing controlling chip.

10. The driving method of claim 9, wherein the step of utilizing the signal receiving circuit to obtain the second voltage data from the timing controlling chip comprises: utilizing the signal receiving circuit to send an instruction to the timing controlling chip and obtaining the second voltage data from the timing controlling chip.

11. The driving method of claim 6, wherein the step of utilizing the control module to examine the first voltage data and the second voltage data in the blank time period comprises: utilizing the control module to periodically examine the first voltage data and the second voltage data in the blank time period.

12. A driving system comprising:
   a storage chip, configured to store a second voltage data;
   a timing controlling chip, configured to receive the second voltage data of the storage chip; and
   a power management chip, configured to output a voltage data to a display panel;
   wherein the power management chip comprises a register, a signal receiving circuit and a processing circuit;
   wherein the register is configured to store a first voltage data, the signal receiving circuit is configured to receive a second voltage data, and the processing circuit is configured to examine the first voltage data and the second voltage data and to write the second voltage data into the register when the first voltage data and the second voltage data are different;
   wherein the power management chip further comprises an examining module, configured to obtain a first examination code, to process the second voltage data to generate a second examination code, to determine whether the first examination code and the second examination code are the same, and to load the second voltage data from the signal receiving circuit when the first examination code and the second examination code are different;
   wherein the power management chip further comprises a control module, configured to examine the first voltage data and the second voltage data in a blank time period of a frame.

13. The driving system of claim 12, wherein the timing controlling chip is configured to receive the second voltage data of the storage chip and to transfer the second voltage data to the power management chip.

14. The driving system of claim 12, wherein the processing circuit comprises a comparing module and a writing module, the comparing module is configured to compare the first voltage data with the second voltage data and trigger the writing module when the first voltage data and the second voltage data are different, and the writing module is configured to write the second voltage data into the register when the writing module is triggered.

15. The driving system of claim 14, wherein the comparing module comprises a comparator, configured to output the second voltage data to trigger the writing module when the first voltage data and the second voltage data are different.

* * * * *